United States Patent
Smith et al.

(10) Patent No.: US 10,388,519 B2
(45) Date of Patent: Aug. 20, 2019

(54) METHOD AND DEVICE FOR INCORPORATING SINGLE DIFFUSION BREAK INTO NANOCHANNEL STRUCTURES OF FET DEVICES

(71) Applicant: TOKYO ELECTRON LIMITED, Tokyo (JP)

(72) Inventors: Jeffrey Smith, Clifton Park, NY (US); Anton Devilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/998,510

(22) Filed: Aug. 16, 2018

(65) Prior Publication Data
US 2019/0058036 A1    Feb. 21, 2019

Related U.S. Application Data

(60) Provisional application No. 62/546,549, filed on Aug. 16, 2017.

(51) Int. Cl.
| | |
|---|---|
| *H01L 29/06* | (2006.01) |
| *H01L 21/02* | (2006.01) |
| *H01L 21/3213* | (2006.01) |
| *H01L 21/8234* | (2006.01) |
| *H01L 21/762* | (2006.01) |
| *H01L 29/66* | (2006.01) |

(52) U.S. Cl.
CPC .. *H01L 21/02603* (2013.01); *H01L 21/32133* (2013.01); *H01L 21/76224* (2013.01); *H01L 21/823431* (2013.01); *H01L 29/0669* (2013.01); *H01L 29/66439* (2013.01); *H01L 29/66545* (2013.01); *H01L 29/0673* (2013.01)

(58) Field of Classification Search
CPC ............. H01L 29/0669; H01L 29/0673; H01L 21/823431
See application file for complete search history.

(56) References Cited

U.S. PATENT DOCUMENTS

| | | | |
|---|---|---|---|
| 9,228,994 B1* | 1/2016 | Cheng | G01N 33/48721 |
| 9,721,793 B2 | 8/2017 | Smith et al. | |

(Continued)

*Primary Examiner* — Thao P Le
(74) *Attorney, Agent, or Firm* — Oblon, McClelland, Maier & Neustadt, L.L.P.

(57) ABSTRACT

A semiconductor device includes a substrate having a working surface, and a plurality of field effect transistor (FET) devices provided on the substrate in a common plane along the working surface. Each FET device includes an active nanochannel structure having opposing end surfaces and a sidewall surface extending between the opposing end surfaces, and an active gate structure surrounding an intermediate portion of the nanochannel structure in contact with the sidewall surface. First and second gate spacers each surrounding a respective end portion of the nanochannel structure in contact with the side wall surface, and first and second source/drain (S/D) structures are in contact with the opposing end surfaces of the nanochannel structure respectively. A single diffusion break provided between first and second FET devices, the single diffusion break including a dummy nanochannel structure connected to an S/D structure of the first FET device and an S/D structure of the second FET device.

20 Claims, 9 Drawing Sheets

(56) References Cited

U.S. PATENT DOCUMENTS

| | | |
|---|---|---|
| 9,997,598 B2 | 6/2018 | Smith et al. |
| 10,243,002 B2 * | 3/2019 | Leobandung ....... H01L 27/1211 |
| 2014/0110755 A1 * | 4/2014 | Colinge ............ H01L 29/41791 |
| | | 257/192 |
| 2018/0061955 A1 * | 3/2018 | Gaben ................... H01L 29/775 |

* cited by examiner

METHOD AND DEVICE FOR INCORPORATING SINGLE DIFFUSION BREAK INTO NANOCHANNEL STRUCTURES OF FET DEVICES

PRIORITY CLAIM AND CROSS-REFERENCE

This present disclosure claims the benefit of U.S. Provisional Application No. 62/546,549 filed on Aug. 16, 2017, which is incorporated herein by reference in its entirety.

BACKGROUND OF THE INVENTION

Technical Field

The present disclosure relates to fabricating semiconductor devices. More particularly, the present disclosure relates to forming and cutting structures such as fins and nanowires.

Transistors, such as field effect transistors (FETs), are the basic elements of microelectronics and integrated circuits. There has been a continuous drive to scale down or shrink transistors and other semiconductor devices to increase density and improve processing performance. Methods of shrinking line-widths in lithographic processes have historically involved using greater-NA optics (numerical aperture), shorter exposure wavelengths, or interfacial media other than air (e.g., water immersion). As the resolution of conventional lithographic processes has approached theoretical limits, manufacturers have started to turn to double-patterning (DP) methods and other patterning techniques to overcome optical limitations to make increasingly smaller features.

SUMMARY

Aspects of the invention include semiconductor devices and methods for forming such semiconductor devices.

One aspect includes a semiconductor device having a substrate having a working surface, and a plurality of field effect transistor (FET) devices provided on the substrate in a common plane along the working surface. Each FET device includes an active nanochannel structure having opposing end surfaces and a sidewall surface extending between the opposing end surfaces, an active gate structure surrounding an intermediate portion of the nanochannel structure in contact with the sidewall surface, first and second gate spacers each surrounding a respective end portion of the nanochannel structure in contact with the sidewall surface, and first and second source/drain (S/D) structures in contact with the opposing end surfaces of the nanochannel structure respectively. A single diffusion break provided between first and second FET devices, the single diffusion break including a dummy nanochannel structure connected to a S/D structure of the first FET device and a S/D structure of the second FET device.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Techniques herein pertain to device fabrication of random and non-random logic utilizing nanochannel structures (such as nanowires or nanosheets), in either a conventional FET device, or in a complimentary FET device is which NMOS electrodes and PMOS electrodes are stacked on top of one another in order to utilize improved device routing and area scaling.

In standard cell designs incorporating FINFET architecture, breaks within an active area are typically accomplished through physically cutting the active FIN and tucking the end of the active FIN underneath either the low-k spacer of a physical gate structure or under part of a dummy or cut gate which has been opened and filled with dielectric material. The purpose of this FIN-tuck technique for standard FINFET is to ensure that the source and drain (S/D) epitaxial growth is consistent and not faceted due to morphological differences between a continuous FIN structure and one that has a terminated segment corresponding with a FIN break. Any change in the morphology of the epitaxial growth on the FIN has a resultant change in the strain put upon that FIN within active regions of the logic cell and thus lead to differences in parasitic and drive current through the device.

Given edge placement tolerances, FIN or active breaks are typically done across multiple gate pitches; with the resulting gate(s) for which the FIN break is started and terminated to be rendered inactive and either integrated as a dummy gate or as a physical "cut" gate in which no gate metals are deposited into the gate and the opened structure is filled with dielectric. By extending the diffusion breaks across multiple gate pitches, significant area is taken up in the standard cell design to accommodate these diffusion breaks. For example, it is estimated that as much as 20% of the cell area for simple standard cells in the east-to-west orientation is occupied by diffusion breaks. Thus, much effort is placed on migrating to single diffusion breaks in which only a single gate structure is needed in order to provide for the diffusion break.

U.S. Pat. No. 9,721,793, by the present inventors, describes a method for forming a single diffusion break for FIN FETs; the entire contents of this document is incorporated herein by reference. In the disclosed method, a FIN is not cut and is left to run continuous through all gate structures. In the region where the single diffusion break is required in a particular design, the replacement gate is opened up to the corresponding area where the diffusion break is designated to be made. Subsequently, the FIN structure is recessed to a position under the shallow trench isolation (STI) or, alternatively, into the bulk-silicon. The low-k spacer around the replacement gate self-aligns the FIN break to the low-k spacer. Accordingly, all epitaxial growth on the remaining FIN is consistent across all S/D regions and there are no drivers for parasitic or drive current issues stemming from faceting of the S/D or from its corresponding impact of strain within the FIN. Once the FIN is recessed in a desired cut area, the replacement gate is converted to a "cut gate" through simply filling in the portion of the gate in the diffusion break area with a dielectric such as SiO or SiN. This technique is known as "cut under poly" as a description of how the process works for FINFET.

However, the present inventors have recognized that, for the case of nanochannel (such as nanowire or nanosheet) applications, the impact of inconsistent strain on the actual nanowires and nanosheets is more pronounced. As such, typical methods used for single diffusion breaks for nanowires and nanosheets are not as straight-forward as they are for FINFET. For FINFET, the silicon or SiGe FIN is running continuous through all S/D regions, whereas for nanowire and nanosheet processing there is typically no physical silicon wire running through any of the S/D regions.

One option for making a cut in the logic cell is to cut the initial Si/SiGe FIN structure and carry on the typical nanowire or nanosheet processing without any further change. In the normal nanowire/nanosheet processing, however, there is effectively no wire running through any of the S/D regions so any remnants of a FIN cut that falls within the S/D region will be effectively removed. While this method provides for its own method of self-alignment to any low-k gate spacer, since the FINCUT had to be done within a gate structure as well, the method leaves no residual silicon or SiGe wire within the low-k spacer of the dummy gate. Thus, any growth of S/D epi from an active gate will not have any S/D epi to merge with from any adjacent dummy gate.

Figure 6:
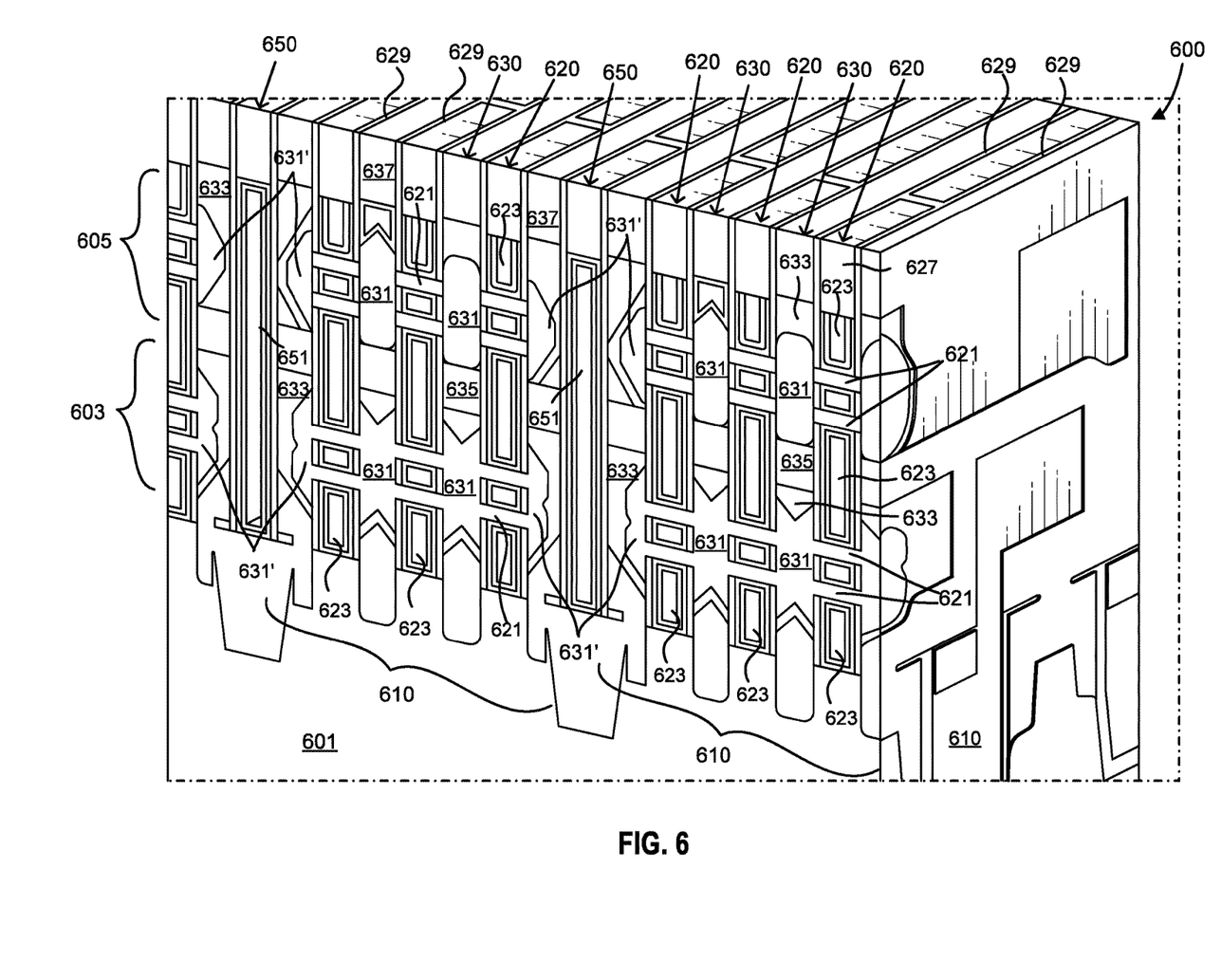
FIG. 6 is a perspective view of a semiconductor device cross sectioned on two sides to show internal structure of the device.

FIG. 6 is a perspective view of a semiconductor device cross sectioned on two sides to show internal structure of the device. This figure shows a structure in which a simple FINCUT is performed for a nanowire or nanosheet device. As seen, the structure 600 is generally made up of a substrate 601 having thereon multiple gate regions 620 alternately arranged with multiple source/drain (hereafter S/D) regions 630. Each gate region 620 includes nanochannel structures 621, gate structures 623, dielectric cap 627, and gate spacers 629. In the device shown, each nanochannel structure 621 provides a multichannel structure for a corresponding FET device. The nanochannel structures 621 may be nanowires or nanosheets, for example. While two nanosheets are shown for each structure 621, a single nanosheet may be used, or multiple nanosheets may be used to implement the multichannel structure. The gate structure 623 is a multilayer structure of high-k dielectric and gate metals that surround the nanochannel structure 621 in a gate all around (GAA) configuration. The dielectric cap 627 protects the gate region from processing performed on other regions of the substrate. Gate spacers 629 are dielectric material for separating conductive portions of the gate region 620 from conductive portions of the S/D regions 630. For purposes of this disclosure, the gate spacers 629 are considered part of the gate region 620.

Each S/D region 630 includes S/D structures 631, S/D contact metal 633, dielectric separation 635 and dielectric cap 637. S/D structures 631 extend from opposing sides of each nanochannel structure 621 to provide a source and drain for current through the channel of an operating FET device. Thus, as seen, the structure 600 includes multiple FET devices. Specifically, the structure 600 includes cells 610 separated by single diffusion break 650 having a dummy gate 651 therein. Each cell 610 includes multiple FETs, six of which are shown in cross section in FIG. 6 As also seen from the cross sectioned FETs, cells 610 include three FETs on a lower level 603 and three FETS on an upper level 605 of the cell. The cells 610 of FIG. 6 provide a complementary FET (CFET) architecture in which the lower level devices are nFETS and the upper level devices are p-FETs.

As also seen in FIG. 6, the S/D epitaxial growth is not consistent within the cell 610. Specifically, FET devices at the end of the cell have end S/D regions 631' with different characteristics than S/D regions 631 provided between adjacent FET devices. The present inventors discovered that such inconsistent S/D regions 631, 631' within a cell 610 can be problematic. For example, inconsistent S/D epi growth will affect the strain put upon that Si or SiGe nanostructure (e.g. wire) running through an active gate. Furthermore, any distortion in the morphology of the S/D epi will lead to differences in available volume for contact metallization. Thus, the S/D 631 grown from two active gates will leave a finite volume for subsequent contact metallization. In the case of a diffusion break, the S/D epi 631'extending from an active gate will not be able to merge with any epi growing from a dummy gate because there will be no epi growth from a dummy gate 650. As such, during metallization of contacts or S/D bars 630, the volume of metal 633 filling in a contact in S/D regions 630 adjacent to a dummy gate 650 will have significantly more metal. The additional metal in the contact region will have significant implications in terms of capacitance between this S/D contact and any adjacent active gates.

Figure 7A:
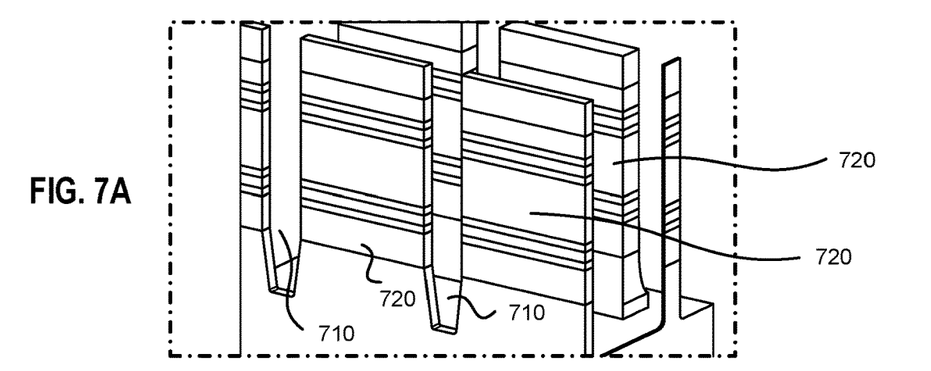
FIGS. 7A, 7B, and 7C illustrate process flow steps in a simple FINCUT approach to forming a single diffusion break.
Figure 7B:
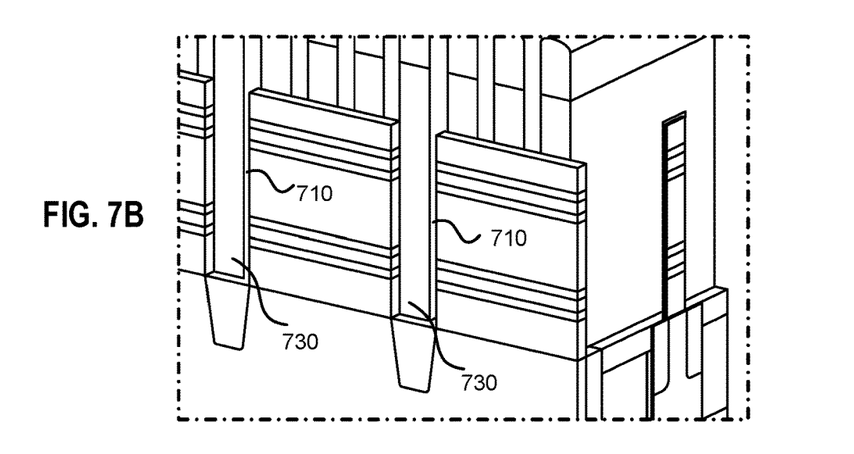
Figure 7C:
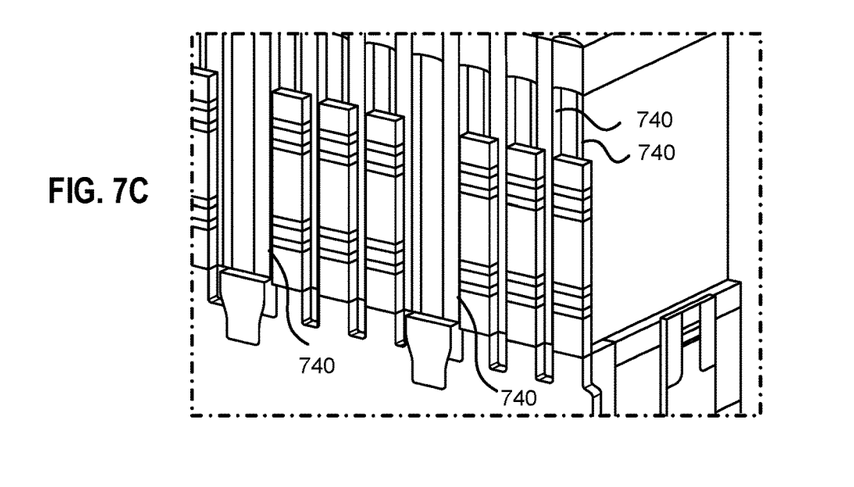

Additionally, the incorporation of a FINCUT method to drive single diffusion breaks for nanowire or nanosheet devices has the negative side-effect of edge-placement concerns since some type of dummy gate is required to be in the position of the single diffusion break as illustrated in FIGS. 7A, 7B, and 7C. In the simple FINCUT approach, as shown in FIG. 7A, a cut 710 must be made into Si/SiGe FIN 720 either as cut-middle or cut-last since this is based on nanosheet device. As shown in the example of FIG. 7B, edge placement error (EPE) placement of the FIN cut 710 needs to be <¼ of width of S/D bar, which creates a potential problem in that a dummy gate 730 must be fit within the FINCUT space 710. That is, the FIN left hanging between gates will be cut and self-aligned to the low-k spacer, and etching the replacement gate between Si/SiGe FINs 720 will be problematic from etch-loading perspective. Finally, as seen in FIG. 7C, COR etch also needs to be able to fit in between the dummy replacement gate 730 and the Si/SiGe FIN 720. COR is a vapor phase etch process which can have extremely high selectivities, and as a vapor-phase etch is very isotropic and is able to etch within complex topographies. The TEL Etch tool which does this is called CERTAS.

Thus, as shown in FIGS. 7A-7C, with the simple FINCUT approach: (1) the dummy replacement gate must still be formed in the relatively tight area of the FINCUT; (2) a low-k spacer must be laterally deposited around this dummy replacement gate; (3) the "normal" method of Si or SiGe selective recess to keep the complimentary material wires or sheets "extended" beyond the intended low-k spacer must be performed in the FINCUT; and (4) subsequent re-forming of the low-k gate spacer around the protruding wires or sheets must be performed. By having a single FINCUT in this region, a lot of dependence is being placed on alignment accuracy of the lithography. This also results in emphasis placed on pattern-dependence of etching where significant heights of material must be deposited and removed with very small "openings" as shown in FIGS. 7A-7C.

Techniques disclosed herein include a method of extending single diffusion breaks in to nanochannel devices such as nanowire and nanosheet devices for random and non-random logic, as well as for complimentary FET (CFET) devices where NMOS and PMOS wires or sheets are run directly overtop of one another. The terms "nanochannel", "nanowire", and "nanosheet" are used interchangeably herein to describe nanoscale structures used to provide a current channel for a FET device.

Techniques herein include multiple methods. One method includes making a single diffusion break through allowing the nanochannel (nanowire or nanosheet) to run continuously through the intended diffusion break area and converting the replacement gate into a local "cut gate" by removing the polysilicon replacement gate material. The "normal" nanowire FIN liner open and release etches are performed, and the replacement gate is filled with a dielectric material. Since the wire runs continuous through the cut gate there can be silicon or SiGe running through the low-k spacer of the cut gate which will be a source for epitaxially growing S/D material from the wires running through the cut gate. Thus, S/D epi growth will be consistent across all S/D and there will be no strain penalty due to areas having faceted or not "full" S/D epi growth between active and cut gates. An example is shown in FIG. 1.

Figure 1:
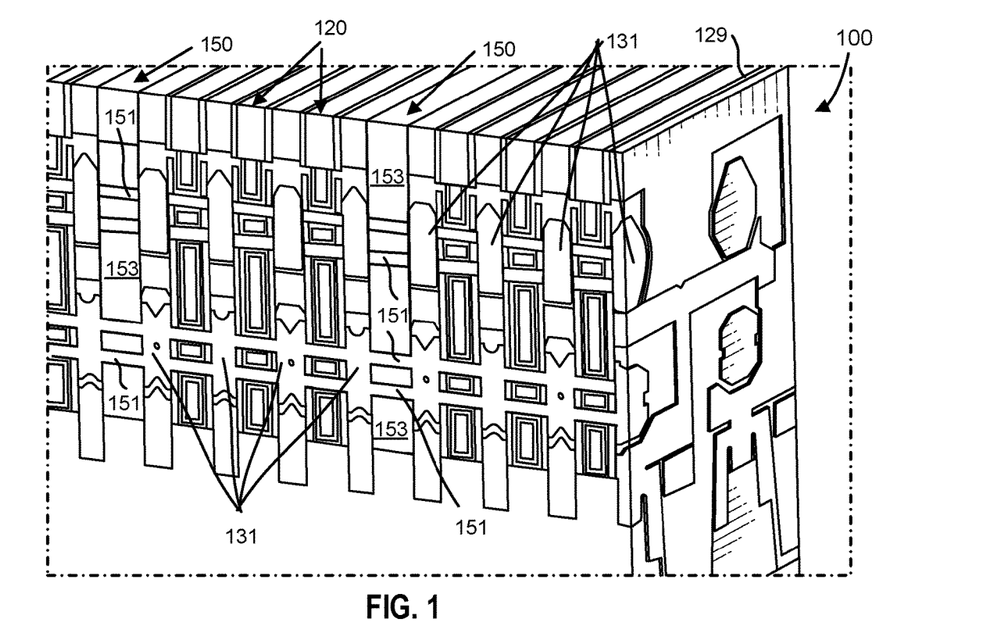
FIG. 1 is a perspective cross-sectional view of a device incorporating single diffusion breaks according to embodiments of the disclosure.

FIG. 1 shows single diffusion breaks for a nanowire incorporated dielectric fill into the dummy gate in accordance with one embodiment of this disclosure. As seen, the structure 100 includes cells isolated from one another by a single diffusion breaks 150, similar to the configuration of FIG. 6 described above. However, nanosheets 151 are allowed to run through dummy gates in order to allow consistent S/D epi 131 to grow across an entire cell. Specifically, a dummy gate is opened at the corresponding gate region 120 and filled with a dielectric material prior to active gate metallization. This process involves opening the dummy gate independent of the active gates, removing the thermal oxide FIN liner, pulling the SiGe, and re-filling the dummy gate portion surrounding the nanosheets 151 with low-k dielectric 153 to form the single diffusion break 150.

The method and device of FIG. 1 leaves silicon or SiGe nanowires or nanosheets 151 to be "floating" within the cut gate regions 120 to form the SDB 150, which may or may not pose a parasitic risk. An alternative method can remove the floating wires from the dummy or cut gate after the S/D epi has already been grown from the floating wires, thereby providing for the consistent strain along the Si or SiGe wires. This process does not leave floating nanowires in the device to ensure that there are no parasitic issues. By cutting the floating wires after the S/D epitaxial growth is completed, the wire and/or sheet cuts are self-aligned through etch selectivity to the low-k spacer, leaving silicon or SiGe "studs" to anchor the grown S/D epi from the dummy or cut gate.

Figure 2:
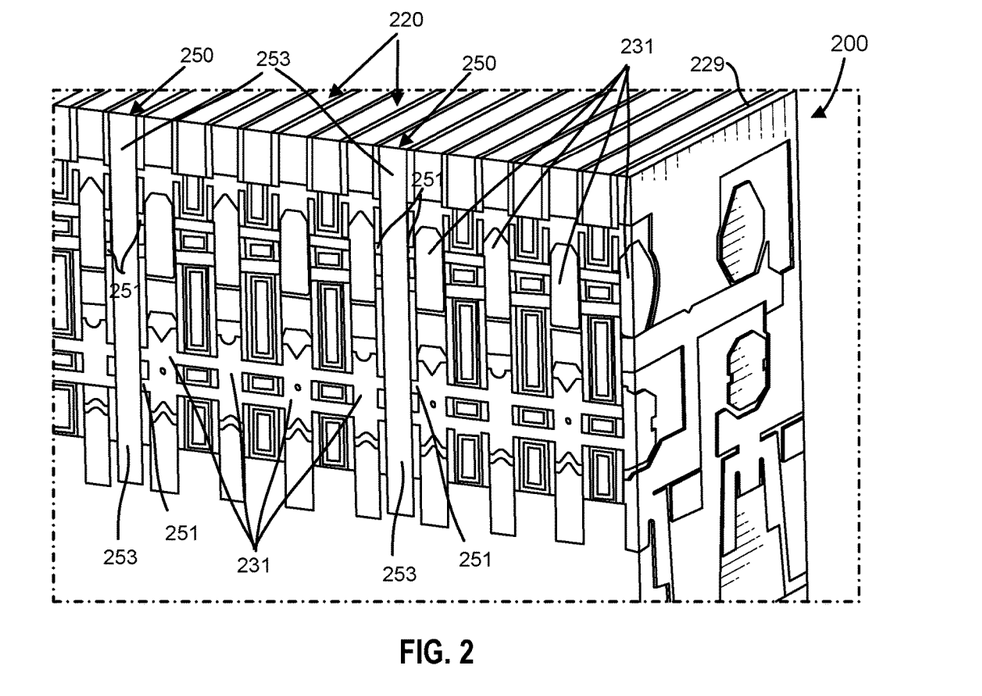
FIG. 2 is a perspective cross-sectional view of another device incorporating single diffusion breaks according to embodiments of the disclosure.

FIG. 2 shows an example structure for self-aligned single diffusing break for nanowires/CFET, according to disclosed embodiments. In this technique, floating wires are removed from the dummy gate region, but S/D epi profile is still well maintained as silicon "studs" 251 that are still embedded in the low-k gate spacer 229. Single diffusion break is done through cutting the wires 221 (etching) within dummy gates designated to provide for a single diffusion break 250. This method can be considered as more complex than that of leaving silicone wires running through the dielectric-filled "cut gates." This process, however, is largely self-aligned because Si/SiGe is removed from an opened replacement gate and silicon group etching is done selective to the low-k spacer 229.

Additionally, since the S/D epitaxial growth 231 is consistent, any subsequent metallization of the S/D contacts will not have unequal volume filling and will negate any potential for capacitance driven failures or performance issues associated with excessive contact metallization adjacent to a gate structure. This is ensured since the available volume for contact metallization is taken up the S/D epi 231, and since there is consistent epi growth from the dummy or "cut" gate, there will be no driver for the additional contact metallization.

Figure 3:
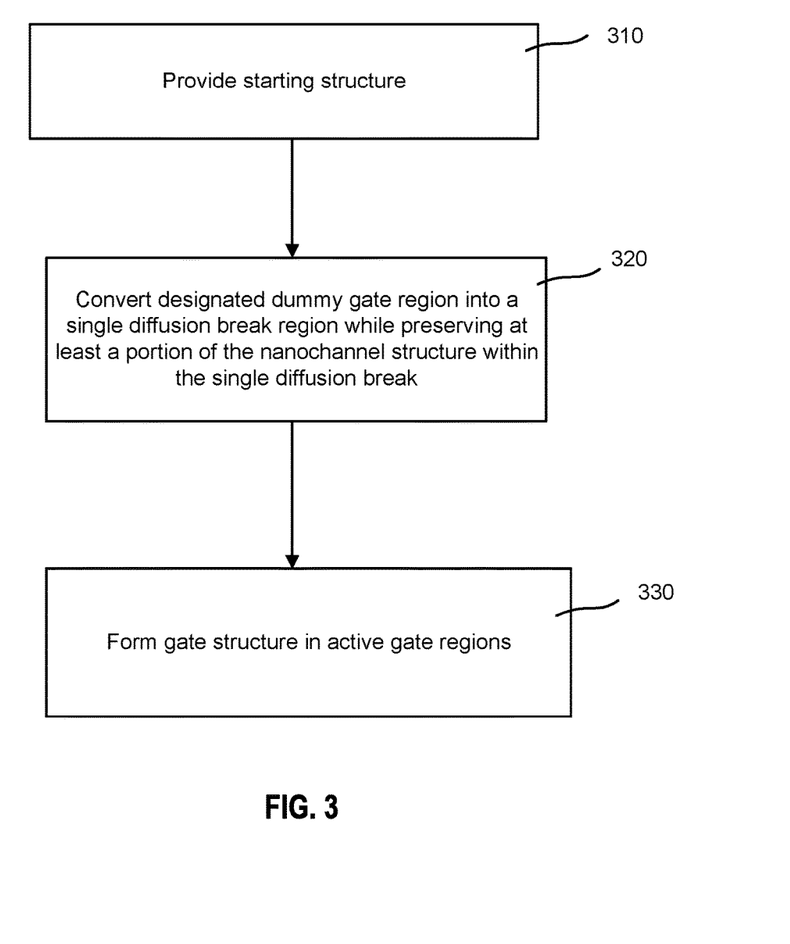
FIG. 3 shows a general process flow for incorporating a single diffusion break into nanostructure devices according to embodiments of this disclosure.

FIG. 3 shows a general process flow for incorporating a single diffusion break into nanowire or nanosheet devices. In step 310, a starting structure is provided. The starting structure is an intermediate structure in the manufacturing process for a nanowire or nanosheet based integrated circuit in which cells include laterally spaced and vertically stacked field effect transistor (FET) devices. The intermediate structure includes lower and upper FETs after epitaxial growth of source/drain (S/D) regions and S/D metallization, but prior to isolation of adjacent cells by a diffusion break.

In step 320, at least one gate region of the starting structure is converted to a single diffusion break region while preserving at least a portion of the nanowire or nanosheet material within the region. In one embodiment, continuous nanowire material between S/D epitaxial regions is preserved, resulting in the floating nanochannel structures described in FIG. 1. In another embodiment, silicon studs adjacent to S/D regions are preserved, as described in FIG. 2. The process then continues in step 330 with removal of replacement gate material in the active gate regions, release of active gate nanowires, and forming GAA structure.

FIGS. 4A-4F show an example patterning integration process for the device of FIG. 2, according to one embodiment of the present disclosure. These drawings pertain to the device integration for a CFET device utilizing nanosheets, in which PMOS sheets are stacked laterally overtop NMOS sheets. Note that explanation here is focused on CFET for convenience, but techniques herein can be employed for conventional FET, for nanowire and nano-sheet devices, equally. Additionally, techniques herein can incorporate buried power rails which may look different compared to a conventional FET device. The fact that buried power rails are used in these drawings, however, has no bearing on the process of incorporating single diffusion break for nanowires.

Figure 4A:
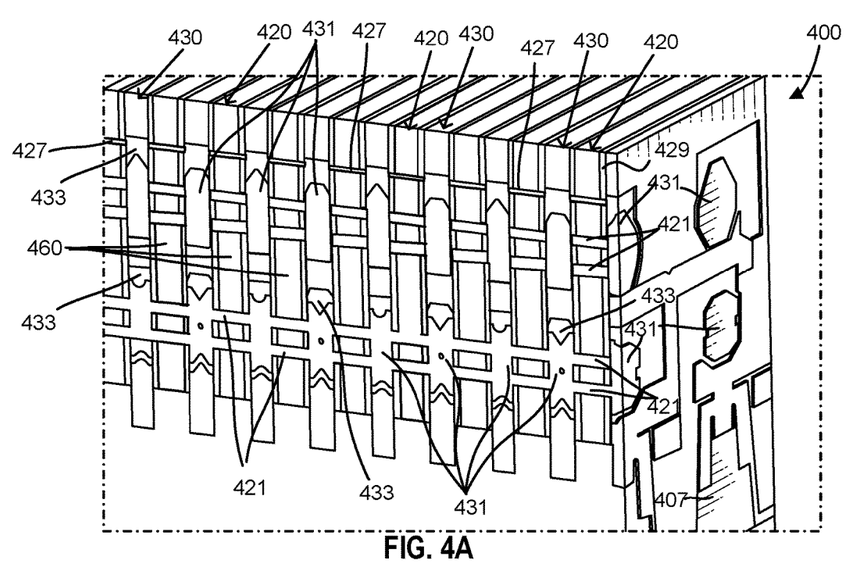
FIGS. 4A, 4B, 4C, 4D, 4E and 4F show an example structures for a patterning integration process for the device of FIG. 2, according to one embodiment of the present disclosure.

FIG. 4A shows a starting structure for the single diffusion break process. As seen, the structure 400 includes gate regions 420 that alternate with source/drain regions 430, and gate spacers 429 provided to separate these regions. Each gate region 420 includes nanochannel structures 421 of silicon material that extend through replacement gate material 460 which surrounds the nanochannel structures 421. Each source-drain region 430 includes source-drain epitaxial semiconductor material 431 and source-drain metal contact material 433. The source-drain epitaxial material 431 is provided on opposing ends of the nanochannel structure 421 to form an individual FET device. As seen, each source-drain epitaxy 421 is merged with the source-drain epitaxy 421 of an adjacent FET device to form a sequential string of FET devices at this point in the process. As the example structure 400 will be used to create a CFET device, a lower level of FET devices are NMOS devices, while an upper level of FET devices are PMOS devices.

The starting structure 400 may be provided by obtaining a prefabricated structure, or by any suitable fabrication process. In one example process for providing a starting structure 400, a continuous Si/SiGe FIN is formed, and power rails are buried in the regions on either side of the FIN. For complimentary FET (CFET) devices, the VDD rail is positioned on one side of the FIN while the VSS rail is positioned on an opposite side. For typical nanowire or nanosheet devices in which NMOS and PMOS still have their respective active areas, a buried rail can be located only on one side of the FIN while the STI is present on the other side of the FIN.

Standard replacement gates 460 are then defined and patterned into polysilicon with a dielectric cap 427 and a surrounding low-k spacer 429 around the replacement gate structure 460. At this step, the Si/SiGe FINs are continuous and have not been through any physical cutting. The replacement gates 460 (typically polysilicon) at this point have a given dielectric cap 427 such as SiN and low-k spacer such as SiCO(N). The FINs will likewise have a particular liner such as thermal oxide to provide protection from polysilicon replacement gate pull process to not remove any of the epitaxial silicon or SiGe from the FIN structure itself.

Next, the FIN liner is opened and the FIN is anisotropically etched selective to the dielectric cap 427 over the replacement gate and the low-k spacer material 429. Such a technique essentially self-aligns the nanowires/nanosheets 421 to the area directly within the replacement gate 460 and low-k gate spacer 429.

In an example in which the current channel is silicon, the SiGe in the FIN area is laterally recessed selectively with respect to the silicon nanowires/nanosheets. The recess will be done in order to provide the silicon nanosheets to extend beyond the replacement gate 460 and through the low-k spacer 429 which will be reformed within the recessed SiGe. Some embodiments may use conventional CFET cells in which the upper and lower channels can be composed of different materials if there is a desire to have PMOS channel made of a material other than silicon, such as SiGe or Ge.

The source and drain structures 431 are grown from the channel materials 421 that are protruding through the low-k gate spacer 429. For the case of complimentary FET, which is shown in FIG. 4A, the S/D process will be different than for the case of conventional nanowire in which NMOS and PMOS are located in separate areas of the standard cell. For the case of CFET, the placement of PMOS and NMOS S/D 431 will be directly over-top of one another. For examples herein, the single diffusion break can be applied to either conventional nanowire or CFET nanowire. The CFET example is used for convenience in describing single diffusion breaking.

For the case of CFET, the S/D bar is formed through a sequential method in which the upper nanowire structure 421 is slightly recessed within the low-k spacer 429 and capped with a material that will not seed epitaxial growth. S/D epitaxial growth 431 is then done from the bottom-most set of nanowires/nanosheets 421. A bottom electrode "pattern" is then memorized into the silicon oxide or other material filling in the S/D bar region. An internal via is then patterned within this bottom electrode pattern and transferred to make contact to the buried power rail 407. The bottom S/D 431 is then metalized to form the lower level contact 433 (in this case this would be NMOS electrode). This metallization process will also fill the internal via connecting the power rail to the bottom contact.

A method to form a dielectric separation 435 between lower and upper levels is then done. For capacitance reasons a method to do dielectric-on-metal selective deposition for this process may be used; however running a simple filling CVD deposition followed by CMP and recess etching is equally effective from a morphological perspective. The cap 427 over the upper channel 421 is then removed selective to the low-k spacer 429. The S/D epi 431 is then grown from the upper channel 421 and metalized. An upper electrode pattern is then memorized within the oxide or other material within the S/D bar. An internal via is then pattered into the existing upper electrode pattern in order to make electrical connection to the corresponding buried power rail 407. The upper electrode and corresponding internal via are metalized with metal 433. The remainder of the S/D bar is then filled with a dielectric material 435 and CMP to be laterally aligned with the top of the replacement gate to provide the starting structure shown in FIG. 4A for a single diffusion break process according to embodiments of the present disclosure.

As seen in FIG. 4A where a cross section is provided through the S/D bar to reveal a shape of the S/D structures 431, upon metalizing the lower and upper electrodes, it is clear that the consistent shape of the S/D epi 431 effectively enables minimizing the metalized electrode 433. The size and shape of the electrode varies by design (how many access points are needed to the local interconnect or up to BEOL for each contact). It is desired especially for CFET to minimize the total volume of metals being used for both electrodes and corresponding internal via connections down to the buried power rail 407 in order to reduce total capacitance between the contacts and the adjacent metal gates.

The single diffusion break for the nanowire or nanosheet process is done through a gate cut in either the replacement or metal gate. For this example process of FIGS. 4A-4F, however, the single diffusion break 450 is done within the replacement gate 460 for ease of demonstration.

The single diffusion break (SDB) process is self-aligned to the single replacement gate to "cut" through etch selectivity to the low-k spacer 429 and to the dielectric film 437 existing at the top of the S/D bar. Such processing provides very high selectivity (over 20:1) utilizing Tokyo Electron Ltd., etching capability on Vigus tX platform. This replacement gate etch benefits from being anisotropic etch, whereas most other replacement gate etches have flexibility to be isotropic. The need for an anisotropic etch in this case is due to the fact that this is not a conventional "replacement gate open" etch, but an etch to place a single diffusion break within a single replacement gate structure.

Figure 4B:
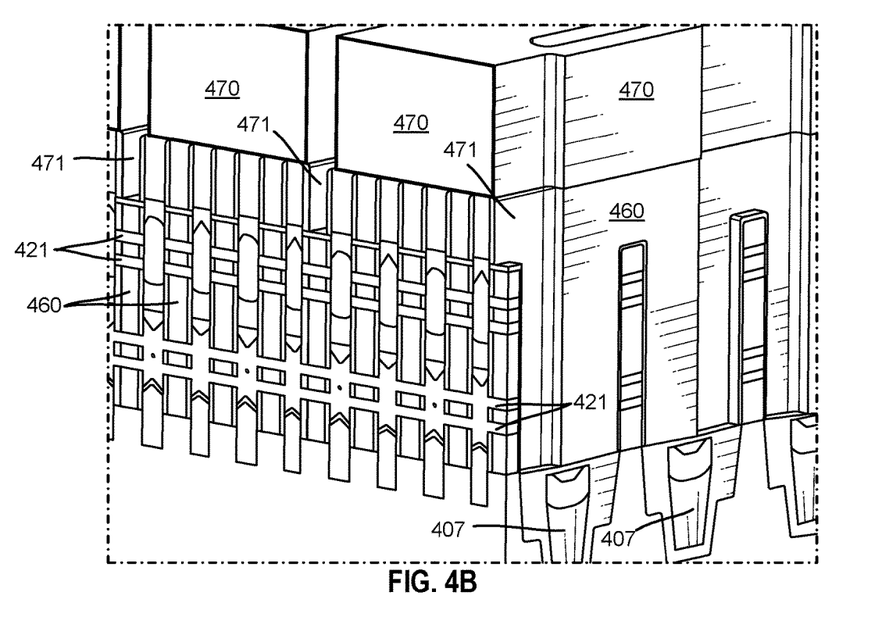

As seen in FIG. 4B, patterned mask material 470 is provided over the starting structure 400, and the polysilicon comprising the replacement gate 460 is then etched to form recess 471. This etch recess 471 exposes the Si/SiGe FIN that is protected by the FIN liner material which is normally comprised of a thermal oxide or other type of material that can exhibit high selectivity to polysilicon in any type of etching.

Figure 4C:
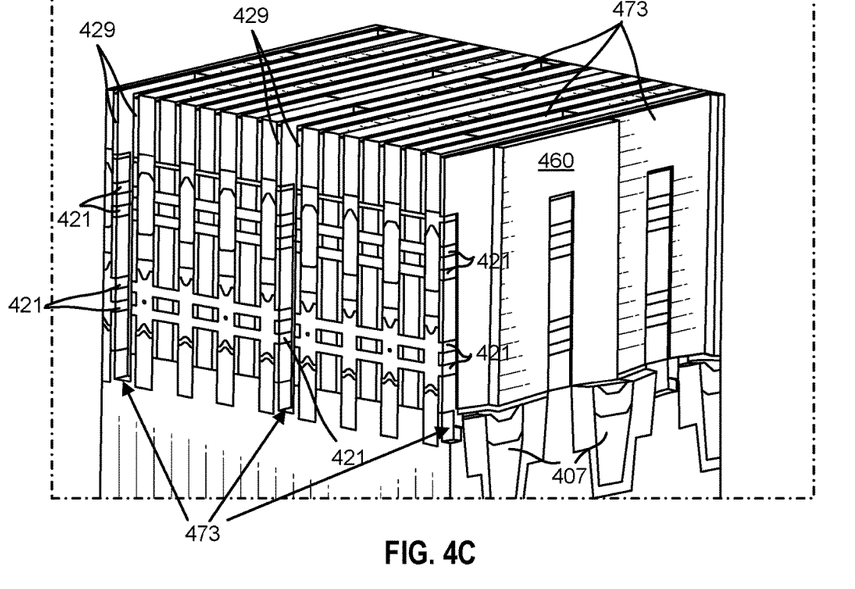

The liner protecting the Si/SiGe FIN is then removed and the exposed FIN is etched anisotropically to form a recess 473 below the intended physical gate structure as shown in FIG. 4C. An isotropic etch can optionally be used in this situation only if the replacement gate material 460 is comprised of a material that is not silicon based, or a material that has good selectivity to Si and SiGe and is thermally stable to the dopant activation done on the S/D.

Since the cut is self-aligned to the low-k gate spacer 429, there are residual channel "studs" 451 left remaining within the low-k spacer 429 which will provide stable anchor points for the already-grown S/D structure 431. Thus, there is no direct exposure of any of the S/D epi 431 to any etch and therefore no mechanism for faceting or deformation of the S/D epi 431 adjacent to any diffusion break area 450. Additionally, since this method provides for the residual channel material studs 451 to be left within the low-k spacer 429, there is no other means for deformation of the S/D between active and either dummy or cut gates. An example result is illustrated in FIG. 4C.

The single diffusion break 450 is then filled with a dielectric material 453 if a gate "cut" is desired, or, alternatively, the single diffusion break 450 is filled with a temporary material so that the nanowires or nanosheets can be revealed in the actual physical gates that for CFET run adjacent to the cut or dummy gates in the north-to-south orientation between standard cells. For the case of this example we are considering the single diffusion break to involve a physical cut gate which is filled with dielectric material 453.

Figure 4D:
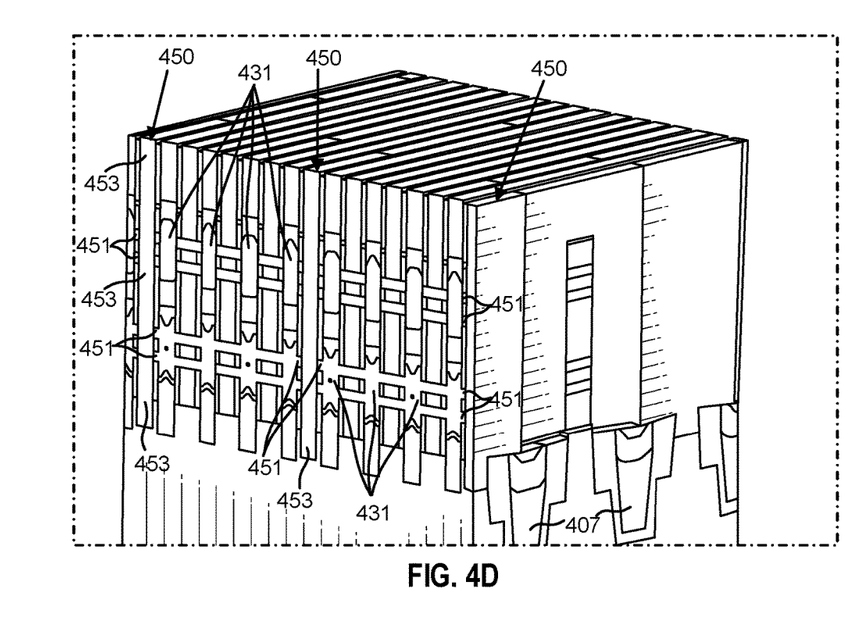

For CFET, one challenge is that most gate structures are "common" between NMOS and PMOS, and the gate is "separated" into upper PMOS and lower NMOS (or vice-versa) through the metallization process. For the case of a single diffusion break 450 for a very complex standard cell in which there is required to be a single diffusion break for one channel and not the other channel, such as would exist for SRAM, and so NMOS and PMOS gates can be physically separated. Such techniques can be incorporated into standard random logic device in order to have a single diffusion break exist only for NMOS or PMOS channel. An example result is illustrated in FIG. 4D.

Figure 4E:
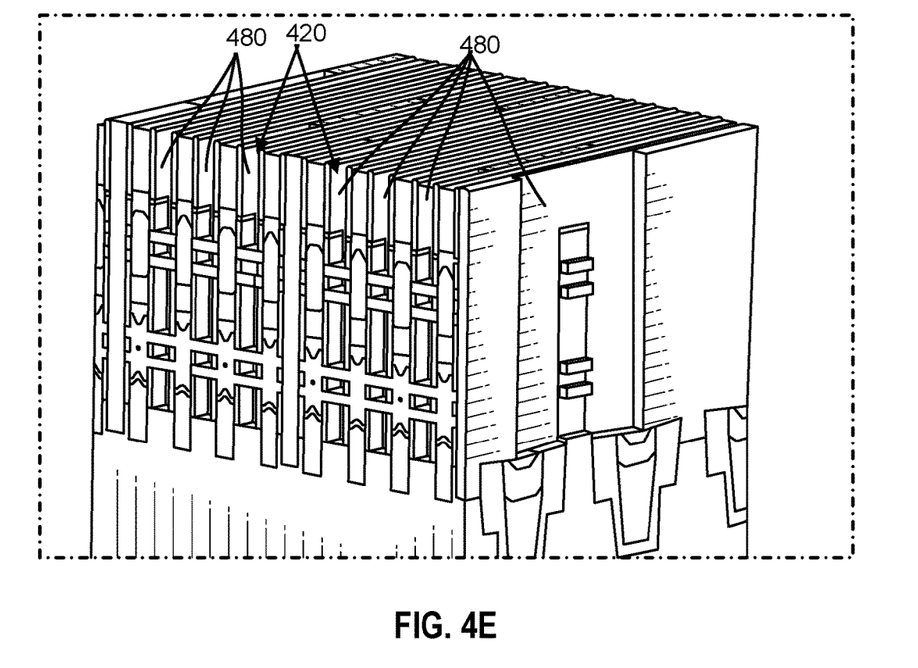

Once the SDB "cut" is made and filled with a dielectric material 453 or any type of replacement material used within the intended dummy or cut gate, the intended active gates are processed. Polysilicon in the replacement gate 460 is pulled in the remaining gate regions 420 which will leave the active Si/SiGe FIN structure within these intended active gates. The SiGe is then removed to release the silicon nanowires or nanosheets 421 within the active gate regions 420. If there is a desire to have PMOS to be a different channel material compared to NMOS, a 3-way selectivity matrix of epitaxial materials can be composed in the FIN structure such as Si:Si:B:SiGe:Ge so that very high selectivity can be used to preserve the desired channel materials while removing the temporary materials within the FIN structure. An example result is illustrated in FIG. 4E, which shows the intended active gate regions 420 having the released nanochannel structures 421 suspended within a recessed trench 480.

The active gates (and dummy gates as well provided that the etch selective replacement material is removed prior to any metallization of the gate) are metalized in a manner such that NMOS and PMOS gates are contained in the same common physical gate or through a dual-gate approach developed Tokyo Electron, Ltd. for SRAM cell design.

Figure 4F:
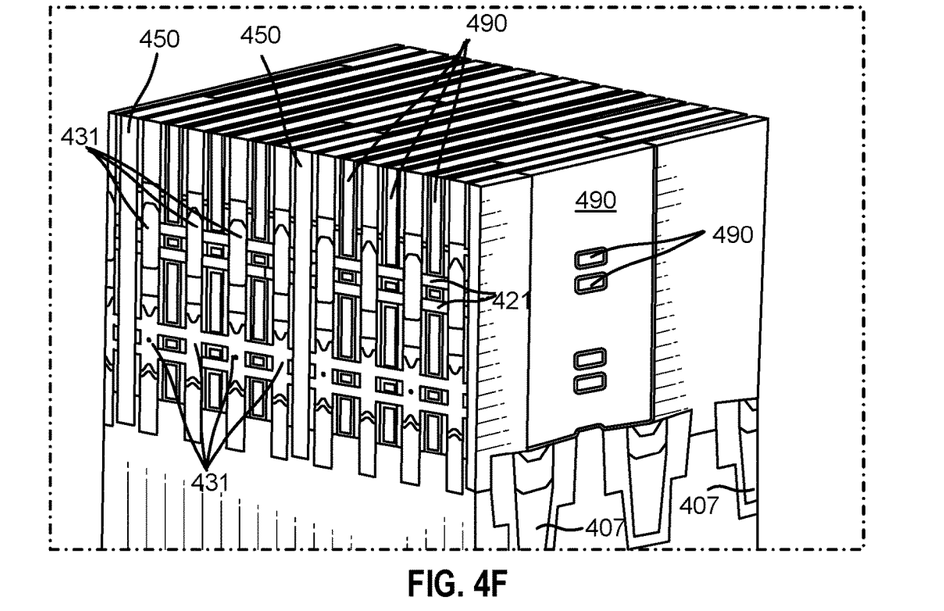

In this example, a common gate 490 is used and this common gate has an NMOS gate positioned under a PMOS gate. This is done through depositing high-k film around both upper and lower gates; depositing gate metals around both upper and lower gates; and depositing NMOS and PMOS work function (WF) metals such that a temporary filling material can be used to selectively cover one channel while exposing another. This method can be executed to support either a single-channel deposition or a single-channel etch depending on integration scheme being used. Deposition of gate metals across NMOS and PMOS is then finished. Final gate metal deposition is executed with metal such as tungsten, cobalt, ruthenium, aluminum, or alloys thereof, for example. An example result is illustrated in FIG. 4F, which is the same structure as FIG. 2 with a cross-section through the GAA structure rather than the S/D bar.

After this step in the integration, all processing follows what is used for conventional logic: Local connections are made to the gate and to the S/D contacts; and connections are then made up to BEOL routing tracks to form the end device.

The process for forming the structure of FIG. 1 is similar to that of FIGS. 4A-4F, except that the nanosheets/nanowires 421 are preserved within the dummy gate region 420 to bridge between opposing S/D epitaxy structures 431. Specifically, after removal of FIN liner, replacement gate material 460 is removed to release the nanowire/nanosheet material 421, and this region is filled with dielectric material 453 prior to gate metallization of active gate regions.

Figure 5:
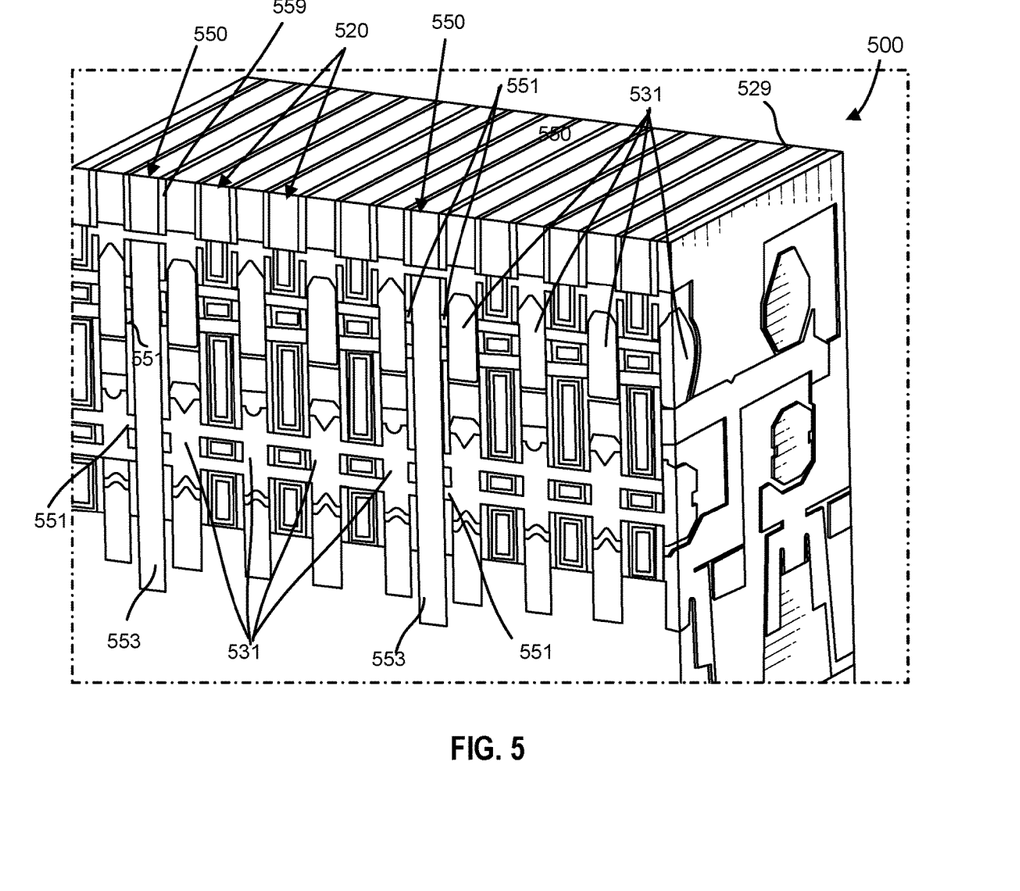
FIG. 5 illustrates a device incorporating a single diffusion break for a nanostructure device according to another embodiment of the present disclosure.

In yet another technique for integration, the Si/SiGe FINs are initially cut but immediately filled in with a dielectric in order to provide another approach for single diffusion break for nanowire or nanosheet processing. An example result is illustrated in FIG. 5. As seen, the structure 500 is similar to that of FIG. 2 in that S/D epi profile is still well maintained as silicon "studs" 551 that are embedded in the low-k gate spacer 559. Additionally, the S/D epitaxial growth 531 is consistent across the cells. The structure 500 includes FIN-FET single diffusion break to nanowire using CUT-BE-YOND-LAST. Nanowires/nanosheets are formed as continuous running Si/SiGe FINs (cuts are done after the FINS are transferred through Si/SiGe stack). After first STI oxide deposition/CMP, a CUT mask is used to open the continuous FINs and the Si/SiGe from cut is etched anisotropically. The cuts in the Si/SiGe fin are then filled with dielectric 553. This method also preserves studs 551 of the wires to allow consistent S/D epi 531 to grow across both active and dummy gates. Thus this is an alternative to cutting wires/sheets within a replacement gate.

Figure 5A:
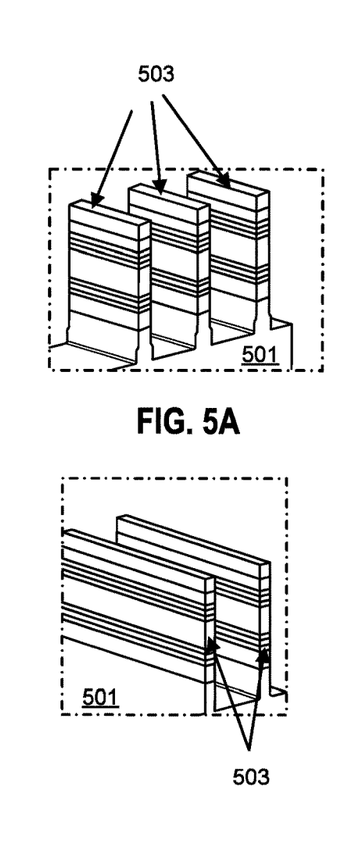
FIGS. 5A, 5B, 5C and 5D show an example structures for a patterning integration process for the device of FIG. 5, according to one embodiment of the present disclosure.
Figure 5B:
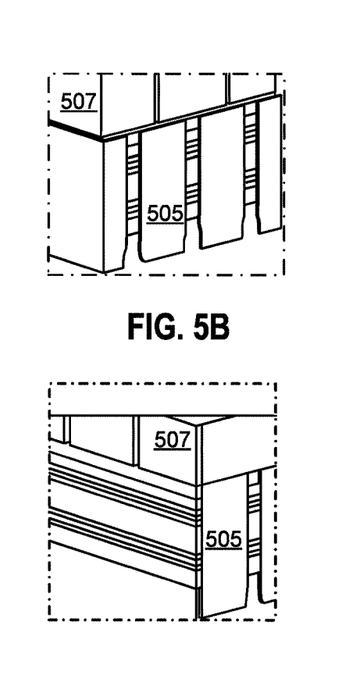
Figure 5C:
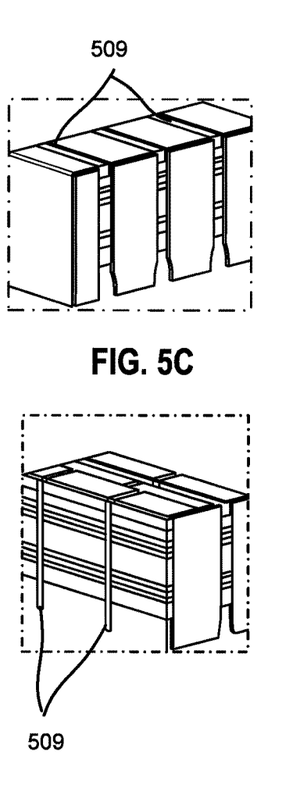
Figure 5D:
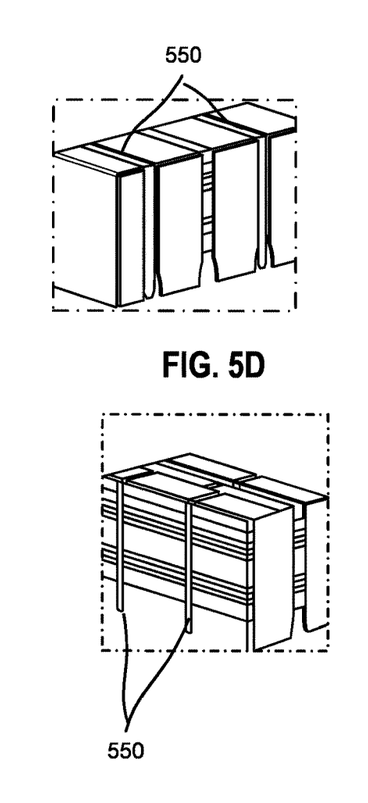

FIGS. 5A, 5B 5C and 5D illustrates a process flow for providing a single diffusion break for nanowire structures as shown in structure 500 of FIG. 5. FIGS. 5A-5D show the single diffusion break process from different perspectives of a starting structure. As seen in FIG. 5A, the starting structure includes continuous multilayer fin structures 503 provided on a substrate 501. The area between fins 503 is then filled with a fill material 505, and a single diffusion break patterned mask 507 is provided over the structure as shown in FIG. 5B. In FIG. 5C, the gate cuts 509 are then anisotropically etched into the fins 503. A dielectric fill is then provided in the cuts 509 to form single diffusion breaks 550 as shown in FIG. 5D.

In this technique it can be difficult to self-align the FIN cut to the intended dummy gate region which is to be done from SADP or SAQP (multipatterning) later in a given process. This techniques also requires a cut to be smaller than a metal gate size so edge placement error (EPE) tolerance does not extend into a region that would prevent the silicon stud formation to ensure consistent S/D epi growth between active and dummy regions.

This method is viewed to be slightly more complex since the SDB will lack any type of self-alignment to the physical gate structure and will be dependent on alignment capability of the method used to form the gate structures (SADP or even SAQP).

Accordingly, various techniques for providing a single diffusion break (SDB) are disclosed herein. In one technique, SDB for nanowire/nano-sheet process is done in the replacement gate module as opposed to cutting the silicon/SiGe superlattice FIN in the initial FIN formation module. Single diffusion breaks for nanowire/nano-sheet are done such that the full epitaxial growth within the source and drain region on both adjacent contacts of the intended diffusion break can be done. Full epitaxial growth on both sides of the single diffusion break area will ensure consistent strain is achieved on the channel passing through adjacent active gates.

Epitaxial growth of the source and drain contacts can be done either before or after the formation of the single diffusion break. For one embodiment of the case of source and drain formation following the single diffusion break in the intended replacement gate, it is necessary for the channel material to be preserved within the low-k or gate sidewall spacer; this will enable the source and drain epitaxial growth to still be achieved from the diffusion break region in order to make a consistent source and drain contact similar to what is formed between two active gates. For an example case of source and drain formation done prior to the single diffusion break, the source and drain contact is protected from any etching of the silicon/SiGe super-lattice within the opened replacement gate by means of etch selectivity provided by the dielectric fill within the contact region or a dielectric cap placed overtop the contact regions. Source and drain contacts can also be metalized prior to the single diffusion break in the replacement gate module provided that a metal such as ruthenium is used which has thermal limitation exceeding the temperature of any critical high-k metal gate (HKMG) processing, such as high-k film annealing which is typically done at temperatures exceeding 700 C.

In some embodiments, formation of the low-k or gate sidewall spacer is completed prior to the opening of the replacement gate in which the diffusion break is to be made. Such a method for nanowire/nano-sheet devices is commonly this is referred to the "inner spacer" in the industry For embodiments in which the intended channel is silicon; the silicon/SiGe superlattice can be processes in an isotropic highly selective etch such as Tokyo Electron CERTAS vapor-phase etch in which the SiGe can be cyclically recessed in order to form a desired amount of space between the stacked silicon channels. The low-k or gate spacer material can then be deposited and anisotropically etched such that the low-k or gate spacer material alone is remaining between the stacked silicon channel wires or sheets. The low-k or gate sidewall spacer is able to provide protection to the stacked nanowires or nano-sheets when then replacement gate is opened within the intended single diffusion break region and the silicon/SiGe superlattice FIN is exhumed in the intended diffusion break region. The remaining channel material contained within the low-k or gate spacer of the replacement gate can be used for growth of the source and drain epitaxial growth for the case where the single diffusion break is done first; or for the case where the source and drain epitaxial growth of the contact is already completed, the containment of the channel within the remaining low-k or gate sidewall spacer will prevent any distortion to the formed source and drain contact.

The polysilicon or amorphous silicon replacement gate can be opened to reveal the silicon/SiGe superlattice FIN with selectivity to the channel preserved within the low-k or gate sidewall spacer, and to the epitaxial source and drain contact that is contained within a filled dielectric film. If the source and drain contacts are already metalized, the contact metal can be recessed in order to place a dielectric with etch selectivity to the low-k or gate sidewall spacer as well as to the polysilicon or amorphous silicon replacement gate Once the desired replacement gate is opened to form the intended single diffusion break, the silicon/SiGe superlattice within the replacement gate can be exhumed or removed, or with a modified etch recipe the polysilicon or amorphous replacement gate and silicon/SiGe superlattice FIN can be removed at the same time. In this embodiment, since there will be channel material contained within the low-k or gate sidewall spacer of the intended single diffusion break; the opened replacement gate with exhumed silicon/SiGe superlattice FIN will need to be filled with some type of dielectric material. A traditional "dummy gate" in which HKMG films are still deposited within the intended single diffusion break cannot be made in this case for nanowire/nano-sheet device as the channel material will connect to the "dummy gate".

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A semiconductor device comprising:
a substrate having a working surface;
a plurality of field effect transistor (FET) devices provided on the substrate in a common plane along the working surface, each FET device comprising:
an active nanochannel structure having opposing end surfaces and a sidewall surface extending between the opposing end surfaces,
active gate structure surrounding an intermediate portion of the nanochannel structure in contact with the sidewall surface,
first and second gate spacers each surrounding a respective end portion of the nanochannel structure in contact with the side wall surface, and
first and second source/drain (S/D) structures in contact with the opposing end surfaces of the nanochannel structure respectively; and
a single diffusion break provided between first and second FET devices, the single diffusion break comprising a dummy nanochannel structure connected to a S/D structure of the first FET device and a S/D structure of the second FET device.

2. The semiconductor device of claim 1, wherein the nanochannel structure comprises at least one of a nanowire and a nanosheet.

3. The semiconductor device of claim 1, wherein the single diffusion break comprises a continuous dummy nanochannel structure extending through the single diffusion break.

4. The semiconductor device of claim 3, wherein the continuous dummy nanochannel structure comprises opposing dummy nanochannel end surfaces and a dummy nanochannel sidewall surface extending between the opposing dummy nanochannel end surfaces.

5. The semiconductor device of claim 4, wherein the single diffusion break further comprises a dielectric material surrounding the continuous dummy nanochannel structure in contact with the dummy nanochannel sidewall surface.

6. The semiconductor device of claim 4, wherein a first one of the dummy nanochannel end surfaces is in contact with a S/D region of the first FET device, and a second one of the dummy nanochannel end surfaces is in contact with a S/D region of the second FET device.

7. The semiconductor device of claim 4, wherein the S/D structure of the first FET device comprises material epitaxially grown from a first one of the opposing dummy nanochannel end surfaces, and wherein the S/D structure of the second FET device comprises material epitaxially grown from a second one of the opposing dummy nanochannel end surfaces.

8. The semiconductor device of claim 1, wherein the single diffusion break comprises a segmented dummy nanochannel structure provided within the single diffusion break.

9. The semiconductor device of claim 8, wherein the segmented dummy nanochannel structure is formed from a portion of a nanowire or a portion of a nanosheet.

10. The semiconductor device of claim 8, wherein the segmented dummy nanochannel structure comprises first and second studs of nanochannel material.

11. The semiconductor device of claim 10, wherein the first stud is provided in a portion of the single diffusion break adjacent to an S/D region of the first FET device, and the second stud is provided in a portion of the single diffusion break adjacent to an S/D region of the second FET device.

12. The semiconductor device of claim 11, wherein the first stud is in contact with an S/D structure of the first FET device, and the second stud is in contact with an S/D structure of the second FET device.

13. The semiconductor device of claim 11, wherein the single diffusion break further comprises a dielectric material surrounding the segmented dummy nanochannel structure in contact with portions of the first and second studs that are not connected to the S/D structures of the first and second FET devices.

14. The semiconductor device of claim 11, wherein the S/D structure of the first FET device comprises material epitaxially grown from the first stud, and wherein the S/D structure of the second FET device comprises material epitaxially grown from the second stud.

15. The semiconductor device of claim 1, wherein each of the S/D structures comprises first material epitaxially grown from a first nanochannel structure and a second material epitaxially grown from a second nanochannel structure, the first and second materials merged to form a respective S/D structure.

16. The semiconductor device of claim 15, wherein at least one of the S/D structures comprises first material epitaxially grown from an active nanochannel structure and a second material epitaxially grown from the dummy nanochannel structure.

17. The semiconductor device of claim 1, wherein the plurality of field effect transistor (FET) devices are lower FET device provided on the substrate in a common lower plane along the working surface, the semiconductor device further comprising a plurality of upper FET devices provided on the substrate in a common upper plane vertically stacked on the common lower plane of the FET devices.

18. The semiconductor device of claim 17, wherein the lower FET devices are nFET devices and the upper FET devices are nFET devices.

19. The semiconductor device of claim 17, wherein the lower FET devices are connected to the upper FET devices in a complementary FET (CFET) configuration.

20. The semiconductor device of claim 17, wherein the lower FET devices and the upper FET devices have a same polarity type.

\* \* \* \* \*